United States Patent

[11] 3,617,826

[72] Inventor Isamu Kobayashi
Kanagawa-ken, Japan

[21] Appl. No. 774,703
[22] Filed Nov. 12, 1968
[45] Patented Nov. 2, 1971
[73] Assignee Sony Corporation
Tokyo, Japan
[32] Priority Nov. 14, 1967
[33] Japan
[31] 42/73155

[54] AN INTEGRATED TRANSISTOR WITH A POLYCRYSTALLINE CONTACT TO A BURIED COLLECTOR REGION
5 Claims, 33 Drawing Figs.

[52] U.S. Cl. .......... 317/235 R,
317/235 AT, 317/235 AM, 317/235 G, 148/176
[51] Int. Cl. .......... H01l 11/00,
H01l 7/36
[50] Field of Search .......... 317/235
(48.7), 235 (22.1), 235 (48.1), 235; 148/176

[56] References Cited

UNITED STATES PATENTS

| | | | |
|---|---|---|---|
| 3,525,025 | 8/1970 | Lowery et al. | 317/235 |
| 3,332,137 | 7/1967 | Kennedy | 29/42.3 |
| 3,475,661 | 10/1969 | Iwata | 317/234 |
| 3,414,783 | 12/1968 | Moore | 317/235 |
| 3,312,882 | 4/1967 | Pollock | 317/235 |
| 3,260,902 | 7/1966 | Porter | 317/235 |

*Primary Examiner*—John W. Huckert
*Assistant Examiner*—Martin H. Edlow
*Attorney*—Hill, Sherman, Meroni, Gross & Simpson

ABSTRACT: Semiconductor devices of the integrated circuit type including contiguous semiconductor regions, portions of these regions containing both a polycrystalline area and a single crystal area.

INVENTOR.

ISAMU KOBAYASHI

BY Hill, Sherman, Meroni, Gross & Simpson ATTORNEYS

INVENTOR.
ISAMU KOBAYASHI
BY Hill, Sherman, Meroni, Gross & Simpson ATTORNEYS

INVENTOR.
ISAMU KOBAYASHI
BY Hill, Sherman, Meroni, Gross & Simpson ATTORNEYS

PATENTED NOV 2 1971

3,617,826

SHEET 4 OF 4

INVENTOR.

ISAMU KOBAYASHI

BY Hill, Sherman, Meroni, Gross & Simpson

ATTORNEYS

AN INTEGRATED TRANSISTOR WITH A POLYCRYSTALLINE CONTACT TO A BURIED COLLECTOR REGION

CROSS-REFERENCE TO RELATED APPLICATION

This application contains features in common with Iwata, Ser. No. 614,160 filed Feb. 6, 1967 and assigned to the same assignee as the present application.

BACKGROUND OF THE INVENTION

1. Field of the Invention

This invention is in the field of semiconductor devices of the integrated circuit type wherein high conductivity regions are provided at selected areas in the device through the use of polycrystalline structures in those areas.

2. Description of the Prior Art

There has been a difficulty in conventional types of semiconductor devices of the integrated circuit type in leading out electrodes to elements of transistors or other circuit elements formed in the substrate. For example, when an effective collector region of a transistor is formed inside a substrate, the resistance of the path leading to the collector region increases, thereby causing an increase in the collector saturation resistance of the transistor. To avoid this type of difficulty, various suggestions have been made. One suggestion, for example, which has been tried previously, was to provide a high conductivity region at one area, for example, the collector of a transistor formed within a substrate and to form a region extending into the high conductivity region by diffusing an impurity into the substrate from the surface thereof. However, this diffusion presents problems since it not only takes a considerable amount of time but also causes lowering of the concentrations in the impurity areas by excessive diffusion resulting from heat treatment and by the formation of unnecessary diffusion layers due to imperfections in the diffusion mask or the like.

SUMMARY OF THE INVENTION

The present invention overcomes the difficulties of the prior art by providing sites for the development of polycrystalline regions in a substrate at selected areas thereof, the polycrystalline regions providing low resistance areas which make possible rapid diffusion velocities therein. Consequently, the present invention provides a semiconductor device which has a low resistance polycrystalline region extending from the interior thereof to its surface. Accordingly, the present invention can be used to provide an integrated circuit having a transistor portion with low collector saturation resistance.

DESCRIPTION OF THE PREFERRED EMBODIMENTS

Figures 1A, 1B, 1C, 1D, 1E, 1F, 1G, 1H, 1I:
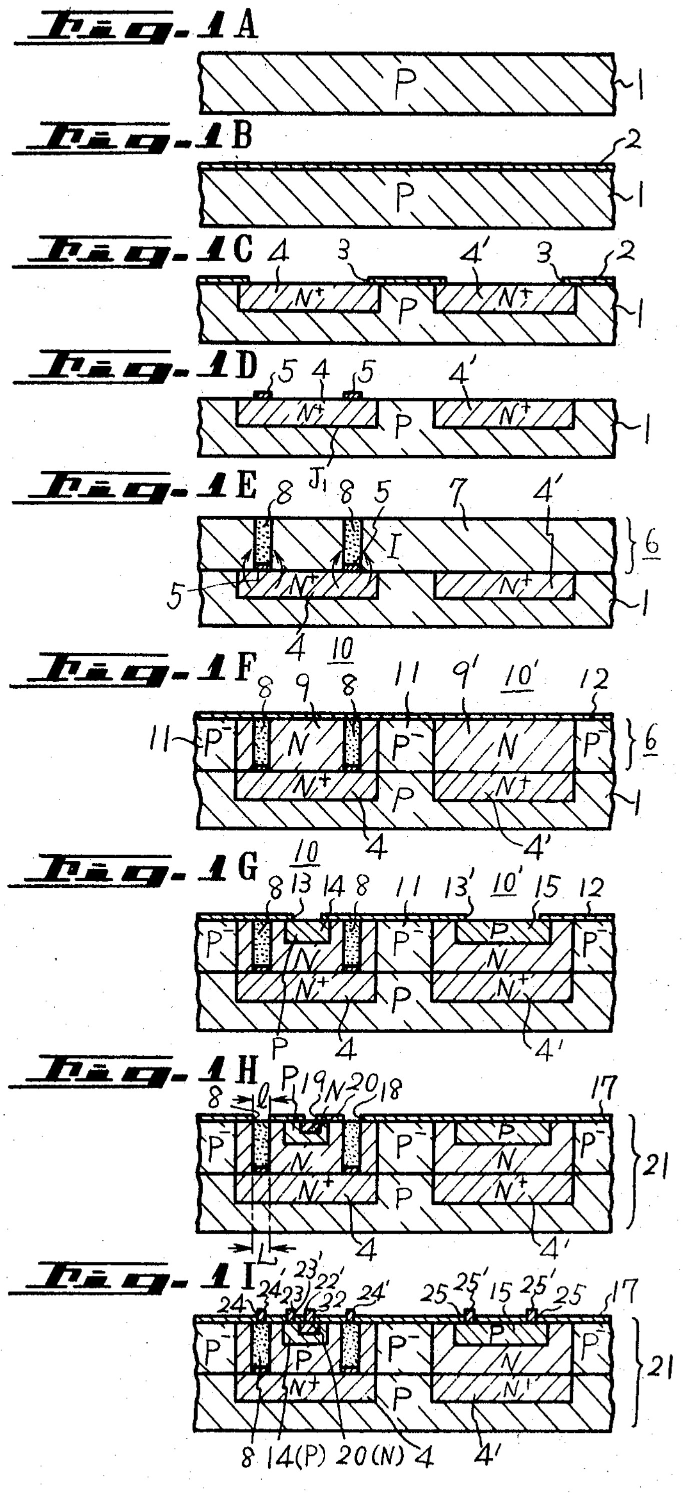
FIGS. 1A through 1I, illustrate in cross section a sequence of operations which may be used in the manufacture of a semiconductor device according to the present invention, with FIG. 1G′ being a modification thereof.

Before proceeding with a description of the preferred embodiments, it should be noted that the figures in the drawings are exemplary only and that the conductivity types specified, for example, for various regions can be reversed if desired.

In FIG. 1A, there is illustrated a P-type, single crystal, semiconductor substrate 1 composed, for example, of silicon. A masking layer 2 composed of silicon oxide, silicon nitride or the like is deposited on the upper surface of the substrate 1 as illustrated in FIG. 1B. This layer 2 can be formed on the substrate 1 to a predetermined depth by means of thermal oxidation, vapor deposition, thermal decomposition or the like, or any of the processes conventionally used in the prior art for this purpose. Next, the oxide layer 2 is coated with a photosensitive material such, for example, as that known commercially under the name "Kodak Photo Resist," and the coated layer is exposed to irradiation by light through a photomask having transparent portions along selected areas thereof, whereby the photosensitive layer is hardened. The provision of such hardened photosensitive layers is common in the semiconductor art and therefore the details of the operation, as well as the corresponding steps in the drawings have not been shown.

The photosensitive material layer is then subjected to a conventional developing process to remove selectively those areas which have not been exposed to irradiation and are consequently not hardened, thus providing an etching-proof mask having windows at predetermined locations on the oxide layer 2. Following this, the semiconductor substrate 1 is immersed in an etchant usually composed principally of hydrofluoric acid to remove the oxide layer 2 at these predetermined areas to form windows 3 as illustrated in FIG. 1C. Following the etching process, an N-type impurity is diffused through the windows 3 into the substrate 1 to form high impurity concentration $N^+$ regions 4 and 4′.

The next step of the process is to remove the remaining portions of the oxide layer 2 which serves as the mask for the diffusion, the removal being accomplished by etching. Next, a seeding site or nucleus 5 for the polycrystalline development is formed on one or more of the layers 4 as shown in FIG. 1D. The seeding site may be composed of any material capable of permitting growth of a polycrystalline semiconductor material which has been deposited thereon by vapor deposition. The seeding site 5 may be formed, for example, by selective deposition of materials such as sodium chloride, silicon, carbon, a silicon oxide, germanium, or similar metal on the surface of the semiconductor substrate 1 through a suitable mask by vapor deposition, cathode sputtering or the like. Another method of providing seeding sites is to alloy an impurity such as aluminum, indium, gallium, antimony, phosphorous, arsenic or the like with the semiconductor substrate along selected areas.

Figure 1G:
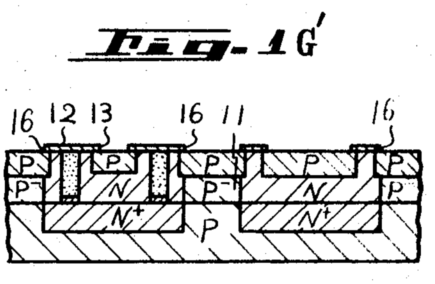

In the form of the invention shown in FIG. 1, silicon is vapor deposited on the upper surface of the substrate 1 whereupon it forms an intrinsic monocrystal layer 7 and polycrystalline layers 8 above the seeding sites 5. Care should be taken so that a seeding site 5 does not lie across a PN junction between the substrate 1 and the layers 4 and 4′. The entire growth layer 6, shown in FIG. 1E, thus consists of a monocrystal layer 7 formed on the surface of the semiconductor substrate 1 and on those areas of the layers 4 and 4′ formed in the substrate 1 in which there are no seeding sites, and polycrystalline layers 8 grown on the respective seedings sites 5. The next step consists in heating the entire assembly so that the impurity present in the layers 4 and 4′ is diffused into the overlying layer 6 to form N-type regions 9 and 9′ while at the same time, the P-type impurity in the semiconductor substrate 1 is diffused into the layer 6 between the areas 4 and 4′ and beyond those areas to provide an integrated circuit having islands 10 and 10′ isolated from each other as illustrated in FIG. 1F.

In the particular circuit illustrated in the drawing, the island 10 serves as a transistor and the island 10′ functions as a resistor in the integrated circuit.

The impurity is diffused into the layer 6 from the layers 4 and 4′ by heating usually at temperatures from 1,050° to 1,250° C. so that the impurity in the layers 4 and 4′ is simultaneously diffused into the layer 6 as the layer 6 is built up. When the N-type impurity is diffused into the regions 9 and 9′ from the layers 4 and 4′, the N-type impurity is diffused into the polycrystalline layers 8 through the seeding sites 5 at a very high diffusion velocity which is believed to be several orders of magnitude as high as that in typical single crystal semiconductor layers. This is believed due to the fact that innumerable grain boundaries and dislocations in the polycrystalline region cause accelerated grain boundary diffusion.

Since the layers 4 and 4′ have high impurity concentration, the impurities diffuse into the monocrystal layer 7 from the layers 4 and 4′. Consequently, the impurity concentration in the monocrystal layer 7 decreases as the upper surface of the layer 7 is approached. However, since the diffusion velocity is high in the polycrystalline layers 8, the impurity concentration is very high at both the upper surface of the layer 4 and the upper surface of the layer 6. Accordingly, the polycrystalline layer 8 has an extremely high degree of conductivity or low resistance. The polycrystalline layer 8 itself serves as an impurity source for the single crystal layer 7, so that some impurities diffused into the monocrystal layer 7 from the polycrystalline layer 8, thereby providing an extremely high degree of conductivity to that portion of the monocrystal layer 7 which adjoins the polycrystalline layer 8. The polycrystalline layer 8 thereby provides convenient high conductivity means connecting the layer 4 with the upper surface of the integrated circuit.

In the foregoing example, the impurity was diffused into the polycrystalline layer 8 from the layer 4 of high impurity concentration through a seeding site 5 formed of elemental silicon. However, when the seeding site 5 is formed of an oxide film such as silicon dioxide which has a masking effect against the diffusion of impurities from the layer 4, the impurities from the layer 4 are diffused into the polycrystalline layer 8 through a portion of the monocrystal layer 7 as indicated by the arrows in FIG. 1E. In the case where the seeding site 5 is formed by alloying an impurity material with the semiconductor substrate 1 or by deposition of the impurity material on the semiconductor substrate to cause nonuniformity of the lattice in the substrate on the surface thereof, the seeding site 5 itself serves as an impurity source, together with the layer 4 and causes diffusion of the impurity into the polycrystalline layer 8, thereby providing a low resistance connection between the layer 4 and the upper surface of the layer 6 as previously described.

After the formation of the islands 10 and 10′, a material capable of serving as a diffusion mask, such as a silicon oxide film 12 is provided over the entire surface of the layer 6 as illustrated in FIG. 1F. Then, the oxide film 12 is selectively removed to form windows 13 and 13′ therein through which a P-type impurity is diffused into the islands 10 and 10′. The P-type impurity diffused into the N-type region 10 forms a base region 14 while the P-type impurity is diffused into the N-type region 10′ providing a resistor region 15 as shown in FIG. 1G.

As a modified form of this procedure, illustrated in FIG. 1G′, additional windows 16 may be formed in the oxide film 12 and a P-type impurity diffused into the preexisting P-type region 11 through the window 16 concurrently with the diffusion of the P-type impurity which forms the regions 14 and 15. This additional diffusion further improves the isolation between the regions 10 and 10′.

Referring now to FIG. 1H, the oxide film 12 is removed and a new oxide film 17 having windows 18 and 19 therein is formed on the surface of the semiconductor device. An N-type impurity is diffused through the windows 18 and 19 as shown in this figure. This additional impurity diffusion is not always necessary, but is very effective for increasing the impurity concentration in the polycrystalline layer 8 and in the N-type region 9 adjoining the layer 6 to provide improved conductivity. In FIG. 1H, the window located above the polycrystalline region 8 has a width 1 which is substantially equal to the width of the polycrystalline region, but the width 1 may be smaller than the width L of that region. Making the width 1 greater than the width of the polycrystalline region L increases the area available for electrode attachment and is therefore preferred from a practical point of view.

The impurity diffused through the window 19 forms an emitter region 20.

For the purpose of attaching electrodes to the various regions, another oxide film 17A is formed on the upper surface of the semiconductor device 21, and is provided with windows identified at reference numerals 22, 23, 24 and 25. A conductive metal such as aluminum or the like is vapor deposited to provide electrodes 22′, 23′, 24′ and 25′ for ohmic contact to external circuit elements, as illustrated in FIG. 1I.

FIGS. 2A through 2F illustrate the manufacture of a beam-lead integrated circuit using the principles of the present invention.

Figures 2A, 2B, 2C, 2D, 2E, 2F:
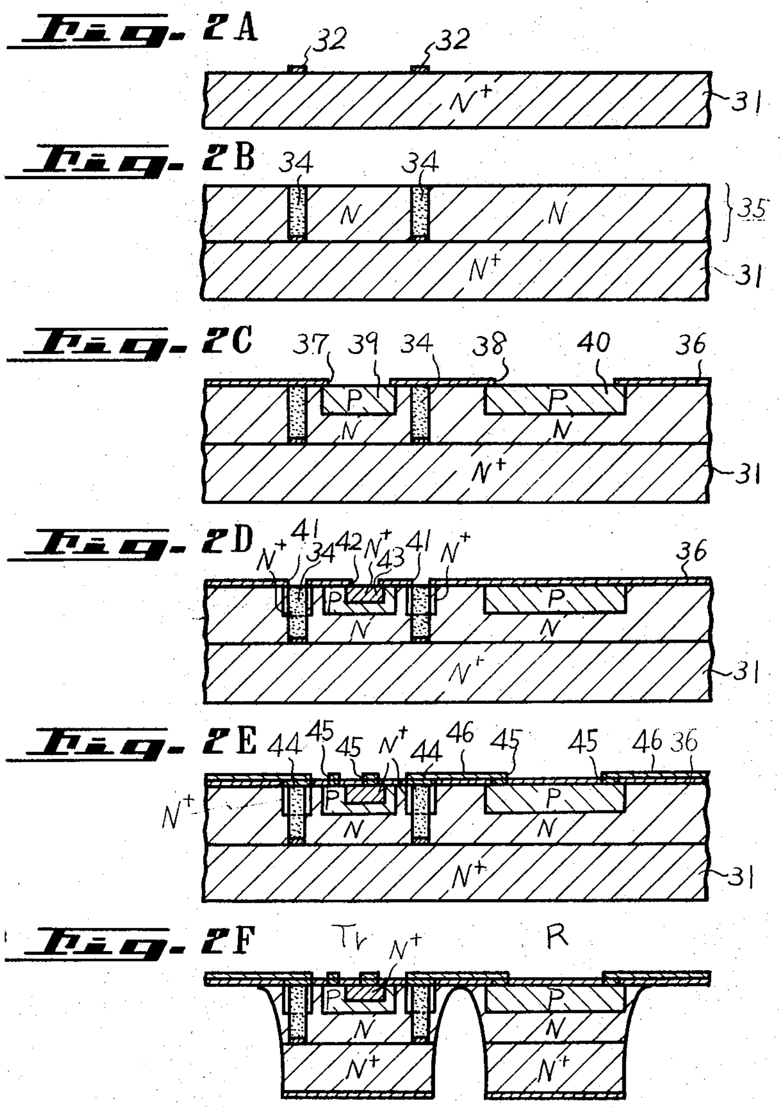
FIGS. 2A through 2F, illustrate in cross section a sequence of steps involved in a modified form of the present invention.

In FIG. 2A, the seeding sites 32 composed, for example, of silicon, are deposited on a silicon substrate 31 having a high N-type impurity concentration. Next, a monocrystal layer 35 is deposited over the substrate 31, and a polycrystalline layer 34 is formed as an incident to the deposition of the layer 35. The polycrystalline layer 34 may be provided in annular form for purposes of convenience. Next, the monocrystal layer 35 is coated, for example, with a silicon oxide film 36 capable of serving as a diffusion mask. The film 36 is selectively removed by the usual techniques to form windows 37 and 38 therein, and then a P-type impurity is diffused into the monocrystal layer 5 to provide a transistor base region 39 and a resistor region 40, as shown in FIG. 2C.

Subsequent to the formation of the regions 39 and 40, the oxide film 36 is further removed at selected areas to form windows 41 and 42 through which an N-type impurity is diffused to increase the impurity concentration in the polycrystalline layer 34 and simultaneously to form an emitter region 43 as illustrated in FIG. 2D. The N-type impurity diffused through the window 41 migrates through the polycrystalline layer 34 at an extremely high velocity for the reasons previously given, and the diffused impurity greatly increases the impurity concentration of the polycrystalline layer 34. This effect is complemented by the diffusion of N-type impurities from the semiconductor substrate 31 to further increase the conductivity of the layer 34.

Figure 2G:
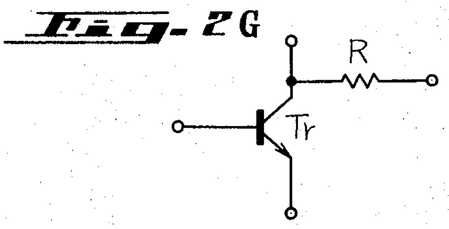
FIG. 2G is an electrical circuit diagram illustrating the equivalent circuit of the device produced in FIGS. 2A through 2F.

The following step is to selectively remove portions of the oxide film 36 to form windows 44 and 45. Ohmic contacts are formed by depositing metal such as platinum in these areas, the platinum being heated up to a temperature sufficient to alloy with the silicon of the respective regions underlying the platinum. Then, titanium and gold are vapor deposited on the oxide film 36 at selected areas and are further plated with gold to form the well known beam-lead electrodes 46 as shown in FIG. 2E. After this, the resulting structure is selectively etched away from the underside to provide the beam-lead integrated circuit having electrically isolated elements as illustrated in FIG. 2F. FIG. 2G shows the electrical circuit diagram of the resulting transistor-resistor combination.

Figure 3:
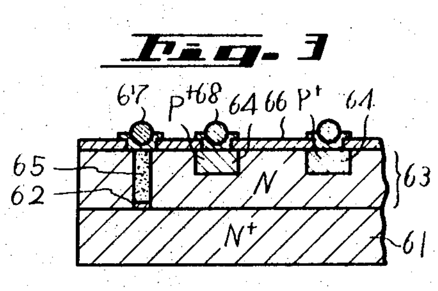
FIG. 3 is a cross-sectional view illustrating a further modified form of the present invention.

FIG. 3 illustrates in cross section a diode unit for use in logic circuits which can be produced according to the principles of the present invention. In FIG. 3, a seeding site 62 is formed on a substrate 61 having a high N-type impurity concentration, and a monocrystal N-type layer 63 is deposited on the substrate 61. Following this, an anode region 64 is provided by diffusing a high concentration of P-type impurity through windows provided in a silicon oxide layer 66. The deposition of the N-type layer 63 causes the formation of a polycrystalline layer 65. As the monocrystal N-type layer 63 is being built up, impurities are diffused rapidly into the polycrystalline region 65, thereby greatly enhancing its conductivity. Electrodes 67 and 68 are then connected to the layer 65 and the anode region 64, thereby providing a diode having a minimum internal resistance. The electrical circuit for the diode is shown in FIG. 3A.

Figures 4A, 4B, 4C, 4D, 4E, 4F, 4G:
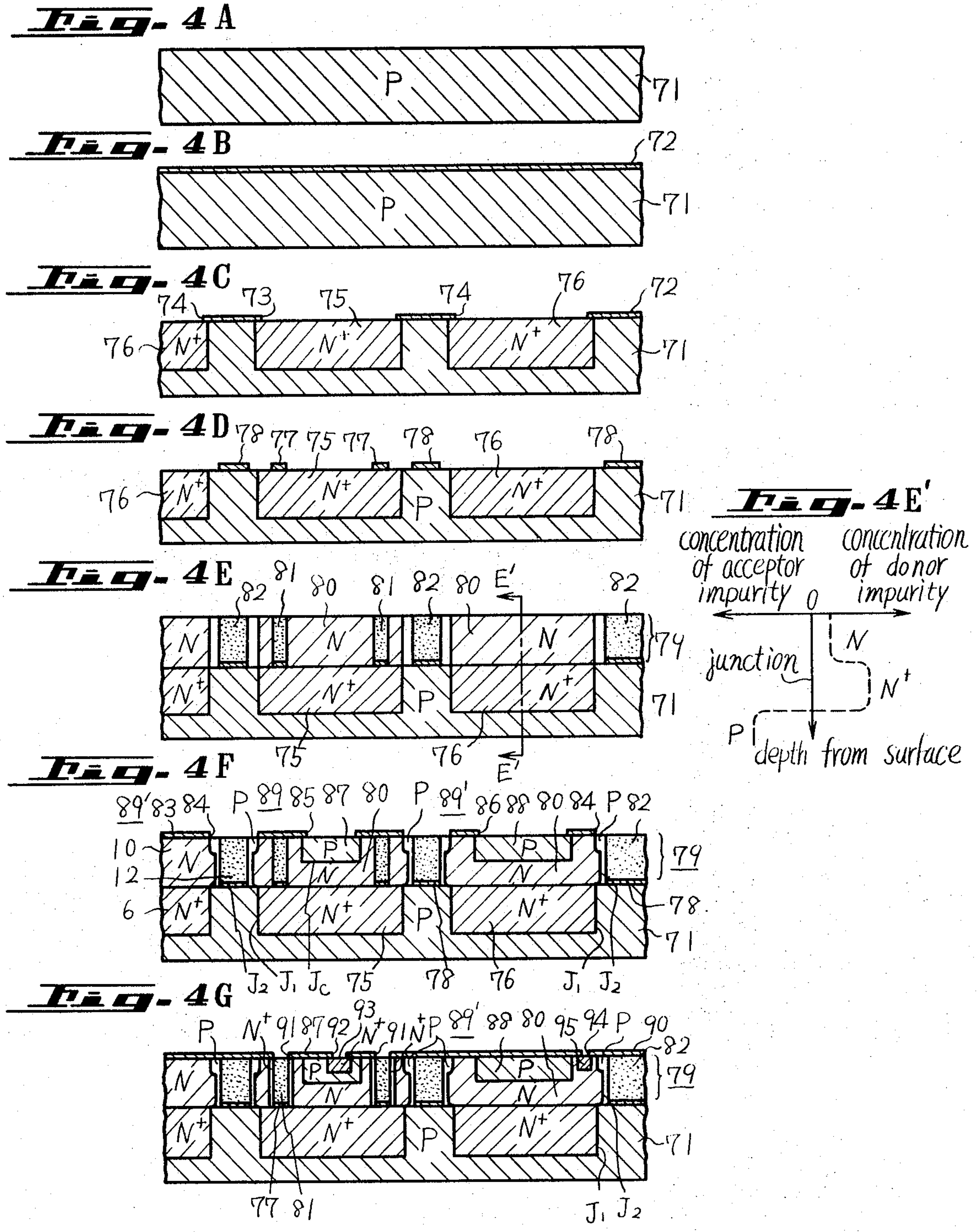
FIGS. 4A through 4G are cross-sectional views showing the sequence of steps used in producing a further modified form of the present invention, with FIG. 4E′ being a graph showing the distribution of impurity concentrations in the semiconductor device.

FIGS. 4A through 4G show a sequence of steps involved in the manufacture of an integrated circuit of the type in which a PN junction is used for the isolation of circuit elements. The first step in this modified process is to provide a silicon substrate 71 composed, for example, of P-type conductivity as shown in FIG. 4A. At least one surface of the substrate 71 is coated with a material serving as a diffusion mask, for example, a silicon oxide film 72 as shown in FIG. 4B. The oxide film 72 is removed at selected areas to form windows 73 and 74 therein through which an N-type impurity is diffused in the silicon substrate 71 to form N-type layers 75 and 76. The N-type layers 75 and 76, respectively, constitute the collector region of a transistor and part of a resistor region. Next, the oxide film 72 is removed and silicon is vapor deposited on the surface of the layer 75 and the substrate 71 at predetermined areas thereof surrounding the N-type layers 75 and 76. The silicon deposition provides seeding sites or nuclei 77 and 78 as shown in FIG. 4D. It is desirable that the seeding site 78 completely circumscribes the layers 75 and 76.

The semiconductor substrate 71 with the seeding sites 77 and 78 thereon is then subjected to a vapor deposition process to form a layer 79 containing a monocrystal layer 80 and polycrystalline layers 81 and 82 over the seeding sites 77 and 78.

Where an intrinsic semiconductor substrate or an N- or P-type semiconductor substrate of extremely low impurity concentration is employed instead of the P-type silicon substrate, the impurity concentrations of the islands 89 and 89′ formed in the layer 79 deposited on the substrate greatly decrease in the vicinity of the boundary between each of the layers 75 and 76 in the substrate and the monocrystal layer 80. In such a case, the impurity concentration of the collector region (the island 89) adjoining the collector junction Jc is low, thereby raising the breakdown voltage of the junction Jc and improving the high frequency characteristics of the transistor. FIG. 4E′ shows the distribution of the impurity concentration in the substrate under these conditions, the section being taken along the line E′—E′ of FIG. 4E.

In order to obtain this type of distribution of impurity concentration as shown in FIG. 4E′, the layer 79 may be formed in several stages, using different impurity concentrations in each vapor deposition. In this case, it is preferable that the N-type impurity of the layers 75 and 76 have as small a diffusion coefficient as possible.

Because of the high impurity diffusion rate in the polycrystalline layers 81 and 82, the N- and P-type impurities of the layer 75 and the semiconductor substrate 71 are diffused into the layers 81 and 82 at an extremely high rate, thereby increasing the conductivities of those areas. Such impurity diffusion may be achieved as an incident in the growth of the subsequently applied layer 79 or in a separate diffusion process conducted for that purpose.

The next step consists in providing an oxide film 83 on the entire surface of the layer 79 and then selectively removing portions thereof to form windows 84, 85 and 86 through which, a P-type impurity is diffused. The P-type impurity diffused into the polycrystalline layer 82, through the window 84, is diffused at a very high rate, and together with the diffusion of the P-type impurity from a substrate 71 serves to greatly enhance the conductivity of the polycrystalline layer 82. It should be mentioned that impurity diffusion through the window 84 is not always necessary as sufficient impurity may be diffused into the polycrystalline areas from the substrate 71. The P-type impurity is diffused from the polycrystalline layer 82 into the monocrystal layer 80 adjoining the polycrystalline layer 82, forming high impurity concentration regions in the layers 80.

The diffusion of the P-type impurity through the window 85 provides a base region 87 in the transistor, while the P-type impurity diffused through the window 86 provides a resistor region 88. In this manner, there are provided islands 89 and 89′ isolated from each other by junctions $J_1$ between the layers 75 and 76 and substrate 71, and by junctions $J_2$ formed in the monocrystal layer 80 as illustrated in FIG. 4F. The island 89 serves mainly as a collector region for the transistor.

After removal of the oxide film 83, the resulting structure is coated with an oxide film 90 over its entire surface, and portions thereof are selectively removed to form windows 91, 92 and 93. An N-type impurity is diffused into the polycrystalline layer 81 through the window 91 to increase the conductivity thereof. In this manner, the subsurface layer 75 is led out onto the surface of the layer 79 through the low resistivity polycrystalline layer 81. The N-type impurity diffused into the base region 87 through the window 92 forms an emitter region 93, while that diffused through the window 94 provides a terminal region 95. The resulting structure is shown in FIG. 4G.

In this form of the invention, even if the P-type impurity is diffused into the polycrystalline layer 82 simultaneously with the diffusion into the base region 87 and the resistor region 88, the impurity is well distributed in the polycrystalline layer 82 within the diffusion time for regions 87 and 88, and the layer 82 exhibits an extremely high degree of conductivity.

Next, an electrode is formed on the polycrystalline layer 82 to connect the surface of the semiconductor element to the P-type semiconductor substrate 71, and an electrode is provided on the terminal region 95. In the electrical isolation of the island 89′ by applying minimum and maximum potentials to each electrode, the junctions $J_1$ and $J_2$ are always supplied with the minimum potential to insure electrical isolation of the island 89′, so that the resistance value of the resistor region 88 does not change.

Figure 5:
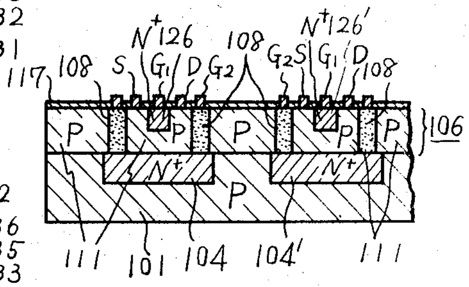
FIG. 5 is a cross-sectional view illustrating a further modified form of the present invention.

The invention is also applicable to field effect transistors, as shown more clearly in FIG. 5 of the drawings. The integrated circuit of junction field effect transistors there illustrated includes upper gate regions 126 and 126′ exposed on the surface of the substrate 101 and lower gate regions 104 and 104′ located within the body of the substrate 101, the gate regions 126, 126′ and 104, 104′, respectively, defining channels therebetween. In this type of element, the lower gate regions are electrically led out to the surface of the element and bias is applied to the gate regions to improve the mutual inductance. The polycrystalline regions 108 are used to electrically lead out the gate regions 104 and 104′ up to the surface of the element and the resistance of the region 108 is minimized to provide for enhanced high frequency characteristics.

The junction field effect transistors can be produced by substantially the same processes as those illustrated in FIG. 1. For example, a P-type silicon substrate 101 is prepared and $N^+$ type layers 104 and 104′ are provided in the substrate 101 at predetermined locations. Then, seeding sites are provided around layers 104 and 104′ in the form of a ring, on which a P-type layer 106 is formed by epitaxial growth techniques. The layer 106 consists of single crystal regions 111 and polycrystalline regions 108. Then, a donor impurity is diffused into only the polycrystalline regions 108 and portions 126 and 126′ which are to serve as the upper gates so as to increase their impurity concentration. Finally, the source, drain and upper and lower gate electrodes S, D, $G_1$ and $G_2$ are respectively formed on the resulting substrate at predetermined locations such as shown in the Figure, thus providing field effect transistors. Reference numeral 117 indicates insulating film deposited on the surface of the substrate.

While in the foregoing examples, the polycrystalline region is employed for external connection of one subsurface layer or region, it may be used for interconnecting a plurality of subsurface layers for external connection as will be described in connection with the following example.

FIG. 6 illustrates such an example in which the invention has been applied to the fabrication of a large capacity diode in which a plurality of junctions are formed in layers to increase the entire junction area.

Figure 6A:
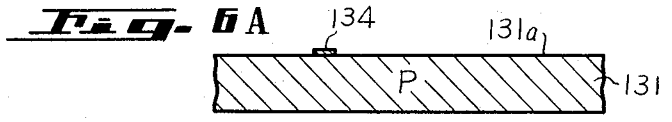
FIGS. 6A through 6F are cross-sectional views showing a still further modified sequence of steps which can be used in accordance with the present invention.

In FIG. 6A a single crystal, semiconductor substrate 131 of P-type conductivity, for example, is prepared and its upper surface 131*a* is polished to provide a mirrorlike surface. Then, a silicon layer is deposited on the surface 131*a* at a selected area thereof to form a seeding site 134 in the same manner as described previously, and as illustrated in FIG. 6A.

Figure 6B:
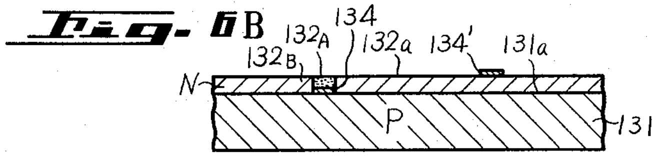
Figure 6C:
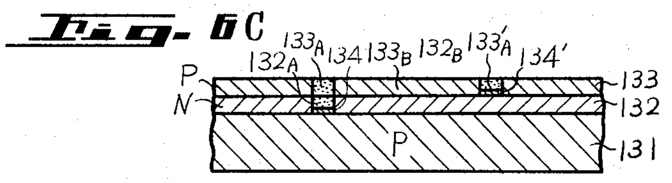
Figure 6D:
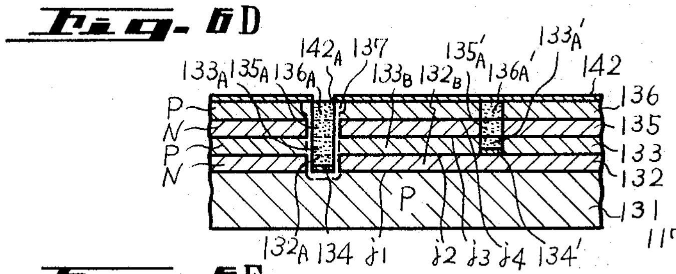

Thereafter, a semiconductor layer 132 of the opposite conductivity-type, that is, of the N-type is formed on the surface 131A of the substrate 131 as shown in FIG. 6B. The layer 132 consists of a single crystal layer 132B and a polycrystalline layer 132A overlying the seeding site 134.

After this, a seeding site 134', similar to the seeding site 134, is formed on the upper surface 132A of the layer 132 at a suitable distance from the seeding site 134, after which a semiconductor layer 133 of the opposite conductivity type to that of layer 132, namely a P-type conductivity layer is formed on the layer 132 by us usual vapor deposition process. Thus, portions 133A and 133A' grown on the polycrystalline semiconductor layer 132A of the semiconductor layer 132 and on the seeding site 134' are polycrystalline semiconductor layers, while the semiconductor layer 133 grown on the other surfaces of the layer 132 is a single crystal layer and has been identified at reference numeral 133B.

Next, a semiconductor layer 135 of N-type conductivity is deposited on the layer 133 by vapor deposition techniques, after which another layer 136 of a conductivity type opposite to that of layer 135 is formed thereon, thereby alternately forming P- and N-type layers in a sequential order to provide junctions $J_1$ $J_2$, etc., between adjacent layers. In this arrangement, portions 135A, 136A, and 135A' and 136A' of the semiconductor layers 135 and 136 grown on the polycrystalline semiconductor layers 133A and 133A' are continuously grown as polycrystalline semiconductor layers. In carrying out these depositions, it is preferred that the temperature involved in each vapor deposition for each of the semiconductor layers 132, 133, 135 and 136 be lower than used in the process for the immediately previously deposited layer so as to minimize the transfer of impurities between the layers.

The next step is to deposit an oxide layer 142 on the uppermost semiconductor layer 136 and then selectively remove portions thereof by photoetching techniques or the like at selected areas to form an aperture 142A overlying the polycrystalline semiconductor layer 136A. An impurity of the same conductivity type as that of the substrate 131 is then diffused into the layer 136A through the aperture 142A. Since the impurity diffusion velocity in the polycrystalline semiconductor portion is far greater than that in the single crystal semiconductor portion, the diffused impurity concentrations in the polycrystalline semiconductor layers 136A, 135A, 133A and 132A become very high. The impurity is also diffused substantially through the layers 136A, 135A, 133A and 132A into the surrounding portions, thereby providing regions 137 of high impurity concentration, that is, high conductivity. The regions 137 extend down to the substrate 131 beneath the seeding sites 134 in the same manner as described in the foregoing examples so that the high impurity concentration regions 137 are formed to extend from the semiconductor layer 136 to the substrate 131, and the P-type regions are electrically connected through the region 137 as seen from FIG. 6D.

Figure 6E:
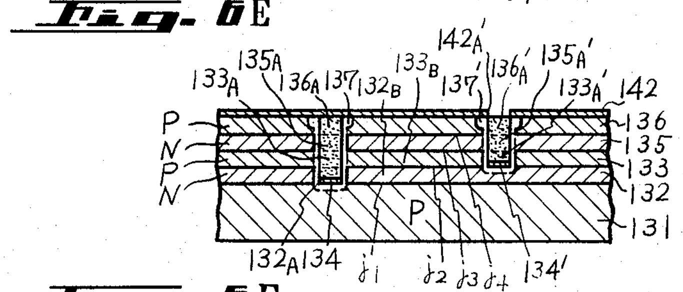
Figure 6F:
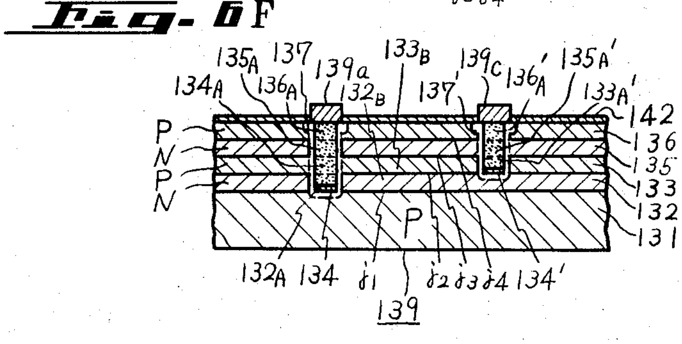

Subsequent to the formation of the region 137', the oxide layer 142 is removed by photoetching or the like at an area overlying a portion 136A of the semiconductor layer 136 to form an aperture 142A'. An impurity of the same conductivity as the layer 132, that is, an N-type impurity, is diffused through the aperture 142A' into the polycrystalline semiconductor layers 133A', 135A' and 136A' and into a portion surrounding them to provide an N-type region 137' of high impurity concentration. The existence of this highly conductive portion electrically couples the N-type layers 132 and 135 together as illustrated in FIG. 6E. The high conductivity region 137' partially projects into the N-type semiconductor layer 132. Thus, the P-type regions and the N-type regions are electrically coupled by high conductivity regions 137 and 137' to provide a large capacity diode 139 having a junction of large area formed by the individual junctions $j_1$, $j_2$, $j_3$, and $j_4$. Electrodes 139A and 139C are deposited on the high conductivity regions 137 and 137' in an ohmic manner as shown in FIG. 6F.

It is preferable that the diffusion of the impurities for the formation of the high conductivity regions 137 and 137' take place over areas wider than the width as of the polycrystalline layers 136A and 136A', that is, including the portions surrounding the polycrystalline layers by suitable selection of shape, size and position for the apertures 142A and 142A'. The electrodes 139*a* and 139*c* are then formed over the portions 136A and 136A' and the high impurity concentration portions surrounding them.

The P- and N-type regions are sequentially formed in layers so as to provide a diode having a large junction area by forming a plurality of junctions in layers. However, since the N-type regions and the P-type regions are coupled by the polycrystalline regions 137 and 137' of low specific resistance, that is, high conductivity, the internal resistance of the diode can be reduced. In a similar manner, a variable capacity diode can be produced.

The conditions for vapor deposition, layer growth, impurity diffusion and similar process steps have not been recited in this specification, since these conditions are well known, from semiconductor technology, and do not form novel features of the present invention.

It will be evident that various modifications can be made to the described embodiments without departing from the scope of the novel concepts of the present invention.

I claim as my invention:

1. An integrated circuit chip comprising a plurality of layers including a substrate layer of semiconductor material and at least one superimposed layer of semiconductor material above said substrate layer, the uppermost of said layers having monocrystalline regions and polycrystalline regions, said uppermost layer having at least one junction transistor formed in one of said monocrystalline regions, said transistor including an emitter of one conductivity type, a base below said emitter of opposite conductivity type and forming a base-emitter junction therewith and a collector below said base of said one conductivity type and forming a collector-base junction therewith, a region of high impurity concentration of the same conductivity type as said collector in the layer immediately below said uppermost layer, which region of high impurity concentration abuts said collector region, said collector region adjacent said base-collector junction having substantially less impurity concentration than said region of high impurity concentration and at least one of said polycrystalline regions being doped with impurities of the same type as said region of high impurity concentration and being of low resistivity from the outer surface of said uppermost layer to said layer therebelow, said low resistivity polycrystalline region being disposed laterally of said transistors and extending through said uppermost layer from the surface of said uppermost layer to a point in contact with said regions of high impurity concentration, whereby a transistor is provided which has both a low resistance from the surface of said chip through said low resistivity polycrystalline region and said high impurity concentration region to said collector of low impurity concentration and a high breakdown voltage in said base-collector junction.

2. An integrated circuit chip comprising a plurality of layers including a substrate layer of semiconductor material and at least one superimposed layer of semiconductor material above said substrate layer, the uppermost of said layers having monocrystalline regions and polycrystalline regions, said uppermost layer having at least one junction transistor formed in one of said monocrystalline regions, said transistor including an emitter of one conductivity type, a base below said emitter of opposite conductivity type and forming a base-emitter junction therewith and collector below said base of said one conductivity type and forming a collector-base junction therewith, a region of high impurity concentration of the same conductivity type as said collector in the layer immediately below said uppermost layer, which region of high impurity concentration abuts said collector region, said collector region adjacent said base-collector junction having substantially less impurity concentration than said region of high impurity concentration and at least one of said polycrystalline regions being doped with impurities of the same type as said region of high impurity concentration and being of low resistivity from the outer surface of said uppermost layer to said layer therebelow, said low resistivity polycrystalline region being disposed laterally of said transistors and extending through said uppermost layer from the surface of said uppermost layer to a point in contact with said regions of high impurity concentration, whereby there is only a relatively small amount of outdiffusion from said region of high impurity concentration to said collector region adjacent said base-collector junction.

3. An integrated circuit chip comprising a plurality of layers including a substrate layer of semiconductor material and at least one superimposed layer of semiconductor material above said substrate layer, the uppermost of said layers having monocrystalline regions and polycrystalline regions, there being regions of seeding site material between said polycrystalline regions and said layer immediately below said uppermost layer, said uppermost layer having at least one junction transistor formed in one of said monocrystalline regions, said transistor including an emitter of one conductivity type, a base below said emitter of opposite conductivity type and forming a base-emitter junction therewith and a collector below said base of said one conductivity type and forming a collector base junction therewith, a region of high impurity concentration of the same conductivity type as said collector in the layer immediately below said uppermost layer, which region of high impurity concentration abuts said collector region, said collector region adjacent said base-collector junction having substantially less impurity concentration than said region of high impurity concentration and at least one of said polycrystalline regions being doped with impurities of the same type as said region of high impurity concentration and being of low resistivity from the outer surface of said uppermost layer to said layer therebelow, said low resistivity polycrystalline region being disposed laterally of said transistors and extending through said uppermost layer from the surface of said uppermost layer to a point in contact with said regions of high impurity concentration, whereby a transistor is provided which has both a low resistance from the surface of said chip through said low resistivity polycrystalline region and said high impurity concentration region to said collector of low impurity concentration and a high breakdown voltage in said base-collector junction.

4. An integrated circuit chip according to claim 3 in which said seeding site material is vapor deposited silicon.

5. An integrated circuit chip according to claim 3 in which said seeding site material is an oxide of silicon.

* * * * *